United States Patent
Tsai

(10) Patent No.: US 7,257,045 B2
(45) Date of Patent: Aug. 14, 2007

(54) UNI-STAGE DELAY SPECULATIVE ADDRESS DECODER

(75) Inventor: Luke Ming-Mou Tsai, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/287,907

(22) Filed: Nov. 28, 2005

(65) Prior Publication Data

US 2007/0121412 A1  May 31, 2007

(51) Int. Cl.
*G11C 8/00* (2006.01)
(52) U.S. Cl. .............................. 365/230.01; 365/230.06
(58) Field of Classification Search ........... 365/230.01, 365/230.06, 230.09
See application file for complete search history.

(56) References Cited

U.S. PATENT DOCUMENTS

| | | | | |
|---|---|---|---|---|
| 5,610,874 A | * | 3/1997 | Park et al. | .................. 365/236 |
| 5,862,098 A | | 1/1999 | Jeong | |
| 5,889,725 A | * | 3/1999 | Aikawa et al. | ........ 365/230.06 |
| 6,026,047 A | | 2/2000 | Ryu et al. | |
| 6,055,203 A | * | 4/2000 | Agarwal et al. | ........ 365/230.06 |
| 6,586,970 B1 | | 7/2003 | Jung | |

OTHER PUBLICATIONS

International search report application No. PCT/US2006/044303 mailed Mar. 27, 2007.

* cited by examiner

*Primary Examiner*—Vu A. Le
(74) *Attorney, Agent, or Firm*—Meyertons Hood Kivlin Kowert & Goetzel, P.C.; Erik A. Heter; B. Noël Kivlin

(57) ABSTRACT

An address decoder. The address decoder includes a plurality of decoder circuits. Each decoder circuit includes a first stage including a first logic circuit having n−1 inputs, the n−1 inputs being a subset of n inputs conveyed to each decoder circuit. Each decoder circuit further includes a second stage having a second and third logic circuits. Both the second and third logic circuits receive an output provided by the first logic circuit. The second logic circuit also receives the other one of the n bits, while the third logic circuit receives its complement. The second and third logic circuits provide second and third outputs, respectively. The address decoder is configured to assert one of a plurality of address selection outputs by asserting one of the second or third outputs of one of the decoder circuits, while de-asserting both the second or third outputs of the other decoder circuits.

20 Claims, 3 Drawing Sheets

UNI-STAGE DELAY SPECULATIVE ADDRESS DECODER

BACKGROUND OF THE INVENTION

1. Field of the Invention

This invention relates to logic circuits, and more particularly, to decoder circuits.

2. Description of the Related Art

Memory arrays are accessed at specific locations by providing an address. Each address has a certain number of bits. Larger memory arrays with a greater number of locations require a greater number of address bits. Thus, larger memory arrays having a larger address space require more logic to decode the address. As the demands for memory space increase as technology advances, the address space and thus the amount of required address decoder logic also increases. Often times with larger address decoders, the large amount of logic presents a bottleneck to memory access speed. Furthermore, the additional logic required for a larger address space can consume a significant amount of circuit area, power, and other resources. With the demand for increasing speed and greater computing resources (including larger memory) competing for circuit area and power, the problems associated with the increasing demands of circuit area, power, and speed created by the demand for decoding large address spaces are exacerbated.

SUMMARY OF THE INVENTION

An address decoder and a method of decoding an address are disclosed. In one embodiment, an address decoder includes a plurality of decoder circuits each representing an address slice. Each decoder circuit includes a first stage including a first logic circuit having n−1 inputs, the n−1 inputs being a subset of n inputs conveyed to each decoder circuit. Each decoder circuit further includes a second stage having a second logic circuit and a third logic circuit. Both the second and third logic circuits receive an output signal provided by the first logic circuit. The second logic circuit also receives the other one of the n bits not included in the n−1 bits, while the third logic circuit receives its complement. The second and third logic circuits provide second and third output signals, respectively. The address decoder is configured to assert one of a plurality of address selection outputs by asserting one of the second or third output signals of one of the decoder circuits.

A method for decoding an address includes conveying 2n bits to the address decoder, half of which represent address signals of an n-bit address, the other half representing complements of the n address signals. A first logic function is performed on a combination of n−1 bits for each of a plurality of bit slices, wherein the combination is unique for each bit slice with respect to the other bit slices. The first logic function produces a first output signal. A second logic function is performed on the first output signal and the one bit not included in the n−1 bits, while a third logic function is performed on the first output and a complement of the one bit. In one embodiment, the one bit may be a least significant address bit, while the n−1 bits are the remaining most significant bits of a combination of signals that includes address signals and/or complements thereof. The second and third logic functions produce second and third output signals, respectively. The address decoder provide an address selection output as an asserted one of the second or third output signals for one of the plurality of bit slices, while both the second and third output signals are de-asserted for each of the remaining bit slices.

BRIEF DESCRIPTION OF THE DRAWINGS

Other aspects of the invention will become apparent upon reading the following detailed description and upon reference to the accompanying drawings in which.

Figure 1:
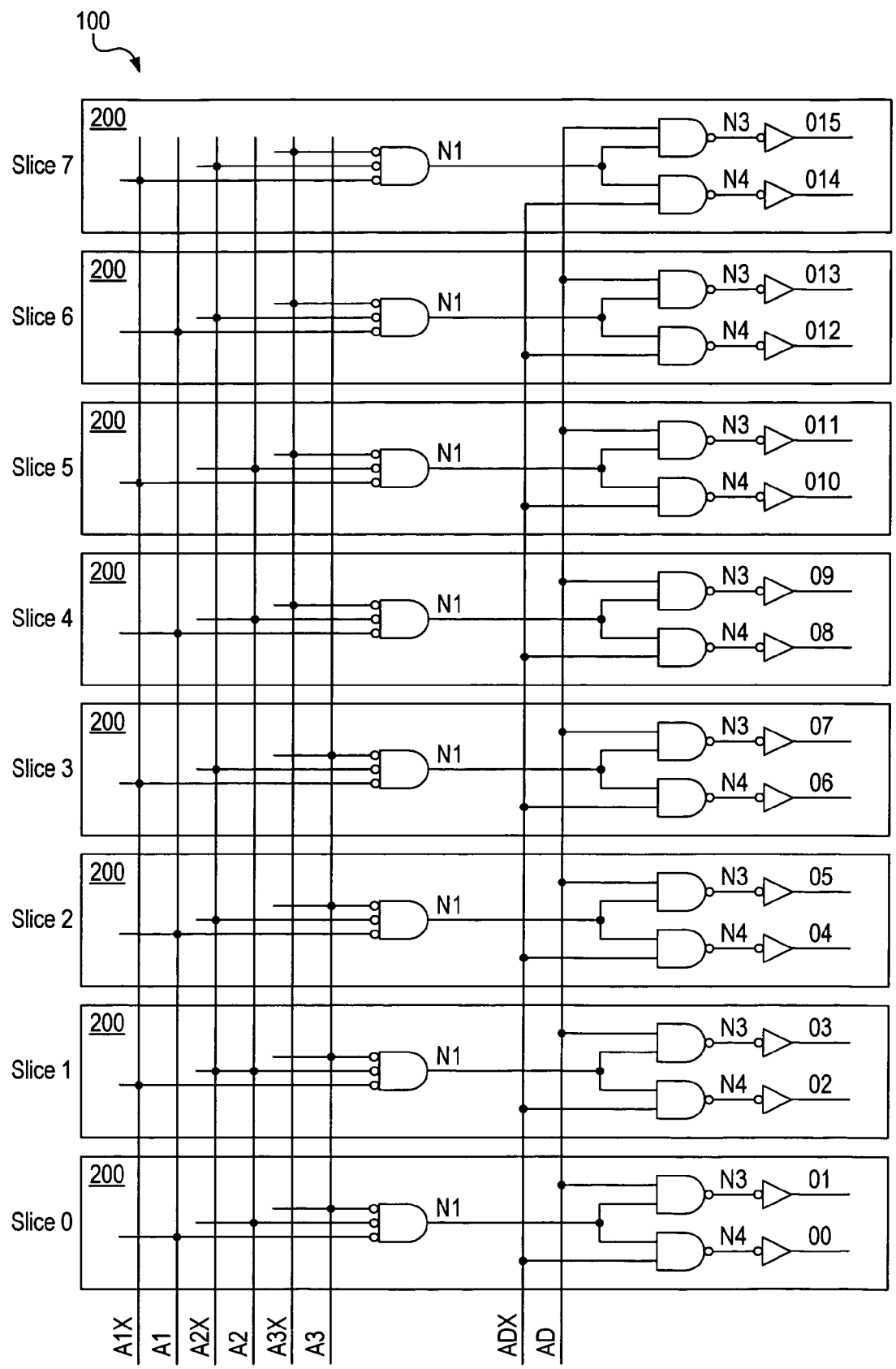
FIG. 1 is a logic diagram illustrating one embodiment of an address decoder.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 1 is a logic diagram illustrating one embodiment of an address decoder. In the embodiment shown, address decoder 100 includes a plurality of decoder circuits 200. Each of the plurality of decoder circuits is a 2-stage decoder and is associated with a slice of address bits. In this particular embodiment, the address to be decoded includes four address bits. However, the 2-stage decoder can be expanded for any size address space without requiring additional stages.

The address to be decoded is an n-bit address. Address decoder is coupled to receive 2n bits of input, wherein the 2n bits include the n address bits and complements of each of the n address bits. Each of the decoder circuits 200 is coupled to receive a 2n input bits in a combination corresponding to a slice of the address bits. Thus, the combination of bits received by each particular one of the decoder circuits 200 is unique with respect to the combination of bits received by the other decoder circuits. The bits received by each decoder circuit 200 include a combination of address signals and complements of the address signals. Each decoder circuit is coupled to receive at least one true address signal and at least one complementary address signal.

The bits received by each of the decoder circuits 200 are partitioned into groups. A first group of n−1 bits is received as a group of inputs to the first stage of each decoder circuit 200. Each of the bits received corresponds to a bit position in the address, regardless of whether the bit is a true address signal or a complement thereof. The first stage of each decoder circuit 200 implements a logic function, in this case a NOR function implemented by the gate shown. The NOR gate shown for each of decoder circuits 200 is coupled to receive the n−1 input signals and perform a first logic function, i.e. a logical NOR in this embodiment. The logic function performed by the first logic gate produces a first output which is propagated on node N1.

The second group of the partitioned bits received by each of the decoder circuits 200 includes a true address signal and its complement, and corresponds to a bit position not included in the first group of bits. In the embodiment shown, the least significant of the address bits and its complement are provided to the second stage. However, the particular bit position of the address signal and its complement provided to the second stage can correspond to any bit position in the address, from the most significant to the least significant. Broadly speaking, those bits received by the first and second stages of address decoder 100 may be partitioned into any combination to suit the particular design, and the particular bit and complement thereof received by the second stage are not required to correspond to the least significant address bit.

The second stage of each decoder circuit 200 includes a second and third logic gates configured to operate in parallel and in this particular example, also includes inverters coupled to the output of each of the second and third logic gates. The logic gates in this embodiment are NAND gates. Second and third logic functions performed in this particular embodiment comprise an AND function performed by a combination of the NAND gates and their respectively coupled inverters. Each of the NAND gates is coupled to receive the first output propagated on node N1. One of the NAND gates is also coupled to receive a true address signal (AO in this embodiment) while the other one of the NAND gates is coupled to receive a complement of the address signal (AOX in this case). An output of one of the NAND gates is propagate to node N3, while an output of the other NAND gate is propagated to node N4. Each decoder circuit 200 includes a pair of outputs, which are provided by inverting a signal on node N3 or node N4 is the particular decoder circuit corresponds to the selected address slice.

An example of the functioning of address decoder 100 is in order here. Assume the address selected corresponds to output 05, which is one of the outputs of the decoder circuit associated with slice 2. This address, the fifth address of sixteen in the example shown, would have an address expressed in bitwise form as 0101. This address, along with its complement (1010) is conveyed to address decoder 100. The first stage NOR gate of the decoder circuit 200 corresponding to slice 2 is coupled to receive as A3, A2X, and A1. Based on input address of 0101, the values of A3, A2X, and A1 are all logic zeros (e.g., A3=0, A2=1 therefore A2X=0, and A1=0), and thus node N1 is asserted as a logic high. For each of the decoder circuits 200 associated with other slices, node N1 is a logic 0 due to a combination of input signals different from that received by the decoder circuit associated with slice 2.

The NAND gate associated with output 05 is coupled to receive as inputs the signal on node N1 and the address signal corresponding to A0. The NAND gate associated with output 04 is also coupled to receive the signal on node N1 as well as the complement of address signal A0, A0X. The combination of input signals provided to the NAND gate associated with node output 05 will produce a logic 0 on node N3. The combination of input signals provided to the NAND gate associated with output 04 will produce a logic 1 on node N4. The logic 1 on node N4 will result in a logic 0 on output 04 due to the inverter coupled to the node. However, the logic 0 on node N3 will result in a logic 1 on output 05 due to its respectively coupled inverter, and thus output 05 is the selected address output, corresponding to the input address of 0101.

Generally speaking, the outputs of a decoder circuit 200 associated with any given slice in this embodiment can be rapidly determined by the following logic equations. For the odd numbered output of any decoder circuit, the value of node N3=N1 NAND A0, and thus its corresponding output is equal to the complement of N3, N3X. Similarly, for the even numbered output of any decoder circuit, the value of node N4=N1 NAND A0X, and thus corresponding output is equal to the complement of N4, N4X. Since the node N1 is a logic high for only one bit slice for any given address, the address can be rapidly determined by determining which the selected slice and the value A0.

Using a circuit configuration such as that shown in FIG. 1, wherein each address slice is subject to no more than two stages of decode, results in a fast decode regardless of the size of the address space. The embodiment shown may be expanded to any size address space by simply adding additional address slices as well as an additional number of address bit inputs to the NOR gate (or other logic function that may be implemented in other embodiments) from which the N1 output is provided. Thus, even for a very large address space, the use of the basic circuit configuration discussed herein allows for the decode operation to be performed in two stages. Furthermore, the circuit configuration is such that there is only a single stage of delay (i.e. the second stage), and thus the amount of delay is the same regardless of the size of the address space. Thus, the delay in decoding the address is substantially the same regardless of the size of the address space, in contrast to other types of address decoders where the delay increases as the address space becomes larger.

Figure 2:
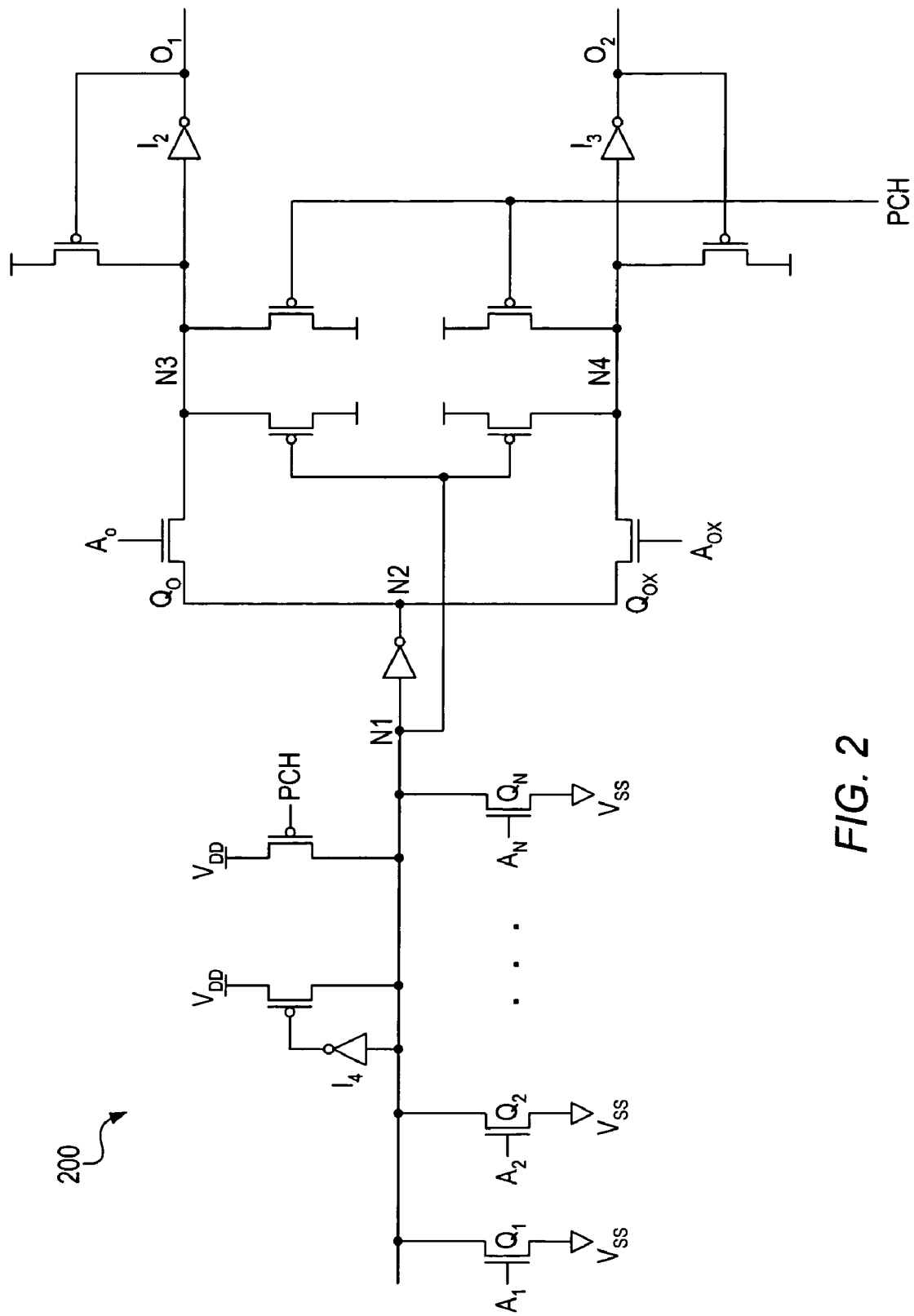
FIG. 2 is a schematic diagram of one embodiment of a circuit used in an address decoder.

FIG. 2 is a schematic diagram of one embodiment of a circuit used in an address decoder. Decoder circuit 200 is one embodiment of a circuit which may be used in an address decoder 100 as discussed above. In the embodiment shown, decoder circuit includes a plurality of input transistors A1 through AN. The inputs received on the gate terminal of each of these transistors correspond to one of the n−1 inputs received by the first stage of each decoder circuit shown in FIG. 1. These input transistors are configured in a wired-NOR configuration, and thus a logic high voltage on the gate terminal of any one of these transistors will result in a logic low voltage on node N1.

Decoder circuit 200 also includes a pair of input transistors coupled in a pass-gate configuration. The channel of transistor Q0 is coupled between node N2 (which is complementary to node N1 due to inverter I1) and node N3, while the channel of transistor Q0X is coupled between node N1 and node N4. A logic high on the gate terminal of either one of these transistors will allow the logic value on node N2 to propagate to the other node to which it is coupled. Since the input values on these two transistors are complements of each other, only one of these transistors will be activated at any given time.

Both output nodes are coupled to a keeper circuit, which is configured to hold a logic high on nodes N3 and N4. The keeper may be a weak keeper circuit such that nodes N3 and N4 can be pulled down sufficiently to change the output of the inverter and thereby minimize crowbar currents.

Prior to receiving an address, decoder circuit 200 is configured for a precharge operation. In this particular embodiment, nodes N1, N3, and N4 are precharged. This precharge operation results in a logic high voltage on each of these nodes, and additionally, results in both of the circuit's outputs O1 and O2 falling to a logic low voltage. Thus, when an address is received, the N1 node for each decoder circuit 200 present in the address decoder is a logic high (and thus N2 is a logic low). Responsive to receiving the address, the N1 node is discharged to a logic low for all but the decoder circuit 200 associated with the selected slice, by virtue of at least one of the inputs A1–AN being a logic high. However, since N1 remains high for the decoder circuit 200 associated with the selected bit slice, N2 remains low, and thus the receipt of the address may allow for a rapid propagation of the low on node N2 to one of nodes N3 or N4, and therefore, a faster decode operation. In effect, the precharge operation pulls high node N1 for each decoder circuit 200, wherein the subsequent receipt of the n−1 bits provided to the first stage will cause N1 to fall low for all but the decoder circuit 200 associated with the selected bit slice.

By pulling the N1 node high for each decoder circuit 200 prior to the first stage receiving the n−1 bits effectively results in a speculative decode. That is, the voltage on node N1 for each of the address slices, including the address slice associated with the address to be selected, will already be in a logic high state prior to any decoder circuits 200 of address decoder 100 receiving any address bits. Since the voltage on node N1 for each address slice is in a logic high state at this point in the operation, the voltage on node N2 will be in a logic low state, while (due to the precharge operation), nodes N3 and N4 will be in a logic high state. As previously noted, the receipt of the n−1 address bits will result in the N1 node falling to a logic low state for all decoder circuits except for the one associated with the selected bit slice. Since N1 will remain high for the decoder circuit 200 associated with the selected address slice, node N2 will be low, and thus the receipt of the second group of partitioned address bits (i.e. A0 and A0X in this particular example) to allow the low on node N2 to propagate to either N3 or N4 of the selected address slice, and thereby cause the assertion of the output associated with the address provided to address decoder 100.

Figure 3:
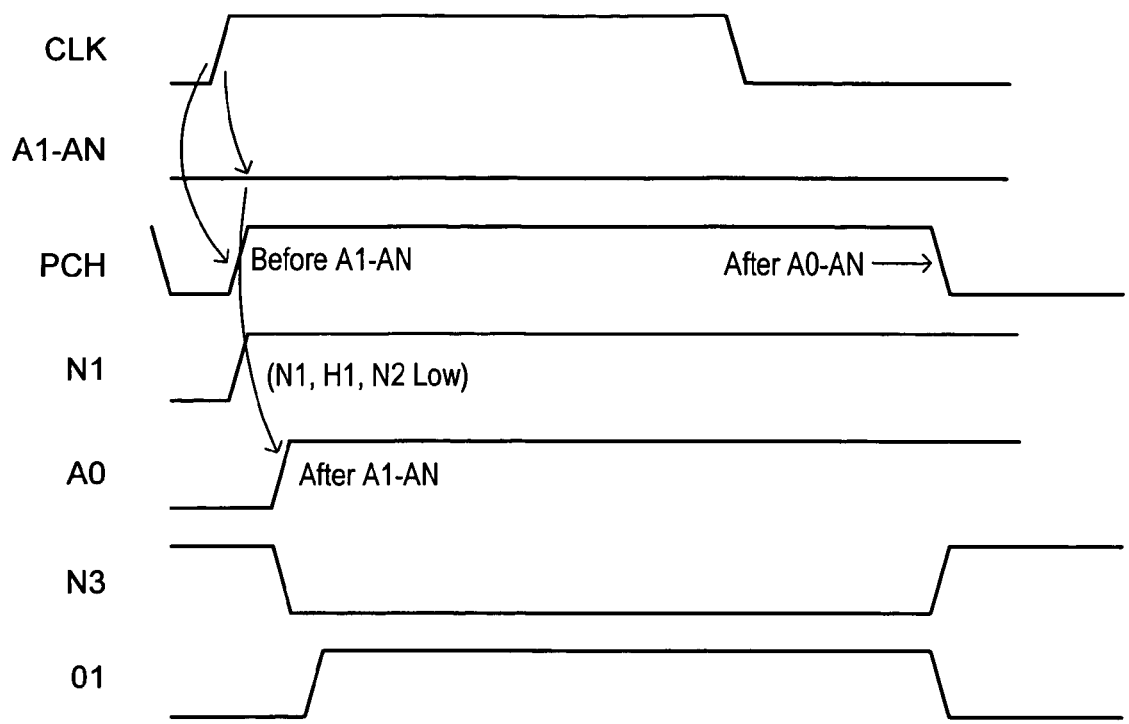
FIG. 3 is a timing diagram illustrating a true decode operation of one embodiment of a circuit used in an address decoder for a true decode.

The operation of the circuit can now be described as follows in conjunction with FIG. 3, which is a timing diagram illustrating a true decode operation of decoder circuit 200. The timing diagram shown herein assumes that bit A0 has a value of logic 1, and further assumes that the decoder circuit corresponds to the selected bit slice. A rising edge of a clock signal is received, and after a small delay, a precharge operation is initiated on decoder circuit 200. The precharge operation is initiated by driving a low voltage to the precharge inputs (PCH), thereby turning on their respectively coupled transistors and pulling nodes N1, N3, and N4 to a logic high state (i.e. logic high voltage). It should be noted that N1 may already be in a logic high state prior to the precharge operation but is shown here as beginning in a low state for this particular example.

Following a short delay after the precharge operation, the address bits, along with their complements are conveyed to the address decoder. Decoder circuit 200 receives its respective bits A1–AN, which correspond to the n−1 bits conveyed to the first stage and which are all low since the decoder circuit is associated with the selected bit slice. Since each of the inputs A1–AN is low, node N1 remains at a logic high voltage (and thus N2 remains at a logic low voltage). Another small delay ensues before bit A0 is received on the input to transistor Q0, thereby turning the turning the transistor on. When transistor Q0 is turned on, the logic low present on node N2 is allowed to propagate, thereby pulling down node N3 (while N4 stays high as a result of the precharge and the keeper circuit shown in FIG. 2). Since N3 is low and N4 is high, output O1 is asserted while output O2 remains de-asserted.

Figure 4:
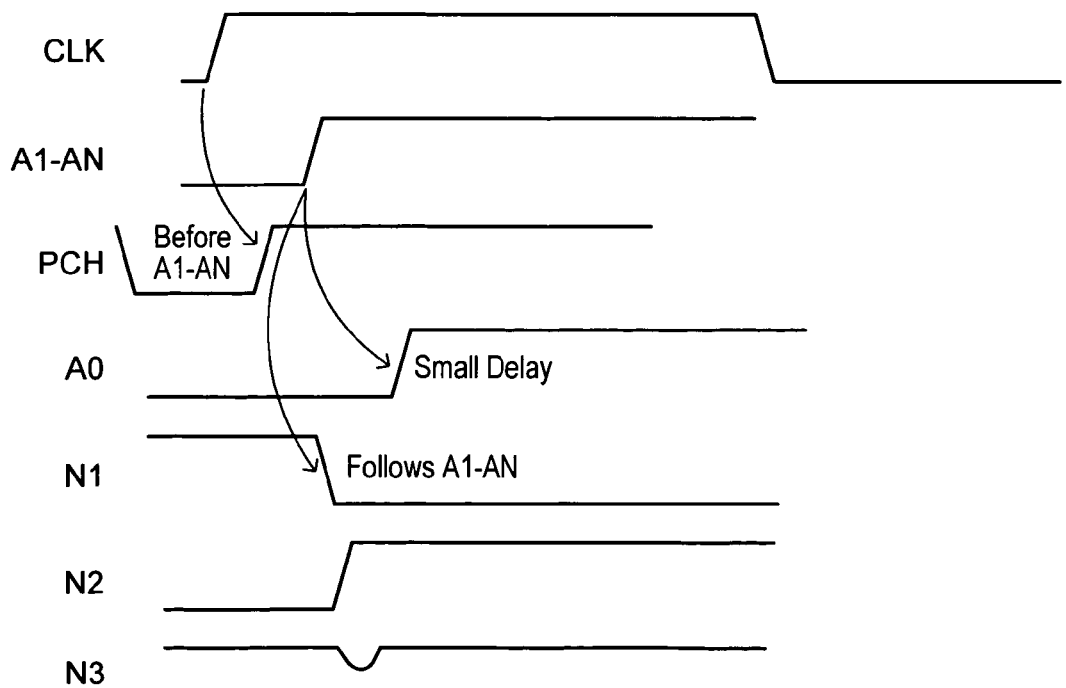
FIG. 4 is a timing diagram illustrating a false decode operation of one embodiment of the circuit used in an address decoder.

The operation of the circuit is further illustrated by FIG. 4, which is a timing diagram illustrating a false decode operation of decoder circuit 200. Following the rising edge of the clock and the precharge operation, decoder circuit 200 receives bits A1–AN. In this case, the circuit is not associated with the selected address slice, and thus at least one of bits A1–AN is a logic high. The logic high on at least one of these bits results in the turning on of at least one of transistors Q1–QN. Turning on one of these transistors results in node N1 being pulled low and thus node N2 is driven high by inverter I1. With node N2 high, both nodes N3 and N4 will also remain high regardless of whether Q0 or Q0X is turned on. In this example, since A0 is high, a small glitch may be produced on node N3 for some embodiments. However, this glitch is easily filtered out by inverter in the output path.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An address decoder configured to decode an n-bit address, the address decoder comprising:
  a plurality of decoder circuits each representing an address slice, wherein each of the decoder circuits includes:
    a first stage, wherein the first stage includes a first logic circuit having n−1 inputs, wherein the logic circuit is configured to provide a first output signal; and
    a second stage, wherein the second stage includes a second logic circuit having an input coupled to receive the first output signal and a third logic circuit having an input coupled to receive the first output signal, wherein the second logic circuit is further coupled to receive one of the n−1 bits, and wherein the third logic circuit is further coupled to receive a complement of the one of the n−1 bits, wherein the second logic circuit is configured to provide a second output signal and the third logic circuit is configured to provide a third output signal;
  wherein the address decoder is configured to assert one of a plurality of address selection outputs by asserting one of the second or third output signals of one of the plurality of decoder circuits, wherein the address selection output corresponds to the n-bit address.

2. The address decoder as recited in claim 1, wherein the address decoder is coupled to receive 2n input signals, wherein half of the 2n input signals are address signals, and wherein half of the 2n inputs are complements of the address signals.

3. The address decoder as recited in claim 2, wherein each of the plurality of decoder circuits is coupled to receive a combination of address signals and complementary address signals.

4. The address decoder as recited in claim 3, wherein the combination of address signals and complementary address signals received by a given one of the plurality of decoder circuits is dependent upon the address slice which it represents.

5. The address decoder as recited in claim 1, wherein the first logic circuit comprises a NOR gate and the second and third logic circuit comprise a NAND gate having an output coupled to an inverter.

6. The address decoder as recited in claim 1, wherein each of the plurality of decoder circuits includes:

a plurality of input transistors each coupled to receive an input on a gate terminal, wherein a channel of each of the first plurality of transistors is coupled between a first node and a reference node;

a first inverter circuit coupled between the first node and a second node;

a first passgate transistor having a first channel coupled between the second node and a third node;

a second passgate transistor having a second channel coupled between the second node and a fourth node;

a second inverter coupled between the third node and a first output node; and a third inverter coupled between the fourth node and a second output node.

7. The address decoder as recited in claim 6, wherein the address decoder is configured to perform a precharge operation on the first, third and fourth nodes of each of the plurality of decode circuits prior to receiving the n-bit address, wherein performing the precharge operation on the first node causes a logic state of the second node to be a logical complement of a logic state of the first node.

8. The address decoder as recited in claim 1, wherein the address decoder is configured to assert the first output signal for each of the plurality of decoder circuits by performing a precharge operation on a first node prior to the address decoder receiving the n-bit address.

9. The address decoder as recited in claim 1, wherein the n−1 inputs represent a most significant subset of a plurality of n bits conveyed to each of the plurality of decoder circuits.

10. The address decoder as recited in claim 1, wherein the one of the n bits is a least significant of the n-bit address.

11. A method for decoding an address, the method comprising:

conveying 2n bits to an address decoder, wherein half of the 2n bits represent address signals of an n-bit address, and wherein half of the 2n bits represent complements of the address signals;

performing a first logic function on n−1 bits of a combination of n bits for each of the plurality of bit slices, wherein the combination of n bits is unique for each of the plurality of bit slices with respect to other ones of the plurality of bit slices, and wherein the first logic function provides a first output signal;

performing a second logic function for each of the plurality of bit slices, wherein the second logic function is performed on the first output signal and one of the n bits, wherein the second logic function produces a second output signal;

performing a third logic function for each of the plurality of bit slices wherein the third logic function is performed on the first output signal and a complement of the one of the n bits, wherein the third logic function produces a third output signal; and providing an address selection output by asserting one of the second or third output signal for one of the plurality of bit slices, wherein the address selection output corresponds to the n-bit address.

12. The method as recited in claim 11, wherein the first logic function comprises performing a NOR function.

13. The method as recited in claim 11, wherein the second and third logic functions each comprise performing a NAND function.

14. The method as recited in claim 13 further comprising the second and third logic functions performing an inverter function subsequent to performing the NAND function.

15. The method as recited in claim 11, wherein an output from the first logic function is conveyed on a first circuit node, wherein an inversion of the first output is conveyed on a second circuit node, and wherein the inversion of the first output is conveyed to one of a third node or a fourth node.

16. The method as recited in claim 15 further comprising performing a precharge function on each of the third and fourth circuit nodes for each of the plurality of bit slices prior to conveying the 2n bits to the address decoder.

17. The method as recited in claim 15, further comprising asserting the first output signal for each of the plurality of bit slices by performing a precharge operation on the first node prior to conveying the 2n bits to the address decoder.

18. The method as recited in claim 17 further comprising de-asserting the first output signal for all but the one decoder circuit responsive to the address decoder receiving the 2n bits.

19. The method as recited in claim 11, wherein the n−1 bits represent a most significant subset of the combination of n bits.

20. The method as recited in claim 19, wherein the one of the n bits represents a least significant of the combination of n bits.

* * * * *